United States Patent
Lee et al.

(10) Patent No.: US 7,402,470 B2
(45) Date of Patent: Jul. 22, 2008

(54) METHOD OF FABRICATING A THIN FILM TRANSISTOR ARRAY SUBSTRATE

(75) Inventors: Hong Koo Lee, Gunpo-si (KR); Kwon Shik Park, Seoul (KR)

(73) Assignee: LG. Display Co., Ltd., Seoul (KR)

( * ) Notice: Subject to any disclaimer, the term of this patent is extended or adjusted under 35 U.S.C. 154(b) by 37 days.

(21) Appl. No.: 11/155,798

(22) Filed: Jun. 17, 2005

(65) Prior Publication Data

US 2006/0049402 A1  Mar. 9, 2006

(30) Foreign Application Priority Data

Sep. 9, 2004  (KR) ...................... 10-2004-0072141

(51) Int. Cl.
*H01L 21/84* (2006.01)
(52) U.S. Cl. .................. 438/158; 438/155; 257/59; 257/E21.412; 349/46
(58) Field of Classification Search .............. 438/158, 438/155; 257/59, E21.412; 349/46
See application file for complete search history.

(56) References Cited

U.S. PATENT DOCUMENTS

| | | | | |
|---|---|---|---|---|
| 6,140,230 A | * | 10/2000 | Li | ................ 438/653 |
| 6,285,041 B1 | * | 9/2001 | Noguchi | ................ 257/61 |
| 6,346,477 B1 | * | 2/2002 | Kaloyeros et al. | ........... 438/680 |
| 2002/0093016 A1 | * | 7/2002 | Lim et al. | ................ 257/59 |
| 2002/0182818 A1 | * | 12/2002 | Kiziloglu et al. | ............ 438/384 |
| 2003/0197182 A1 | * | 10/2003 | Kim et al. | ................ 257/72 |
| 2004/0056251 A1 | * | 3/2004 | Kim et al. | ................ 257/72 |
| 2004/0195571 A1 | * | 10/2004 | Ahn et al. | ................ 257/72 |

* cited by examiner

Primary Examiner—Bradley W. Baumeister
Assistant Examiner—Steven J Fulk
(74) Attorney, Agent, or Firm—Brinks Hofer Gilson & Lione

(57) ABSTRACT

A thin film transistor array substrate and a fabricating method for simplifying a process and reducing a manufacturing cost. In the thin film transistor array substrate, a gate line is formed on a substrate and a gate insulating film is formed on the gate line. A data line is provided in such a manner to intersect the gate line with having the gate insulating film therebetween, and contains any at least one of tungsten silicide ($WSi_x$), cobalt silicide ($CoSi_x$) and nickel silicide ($NiSi_x$). A thin film transistor is provided at each intersection between the gate line and the data line. A pixel electrode is provided at a pixel area defined by each intersection between the gate line and the data line and is connected to the thin film transistor.

5 Claims, 13 Drawing Sheets

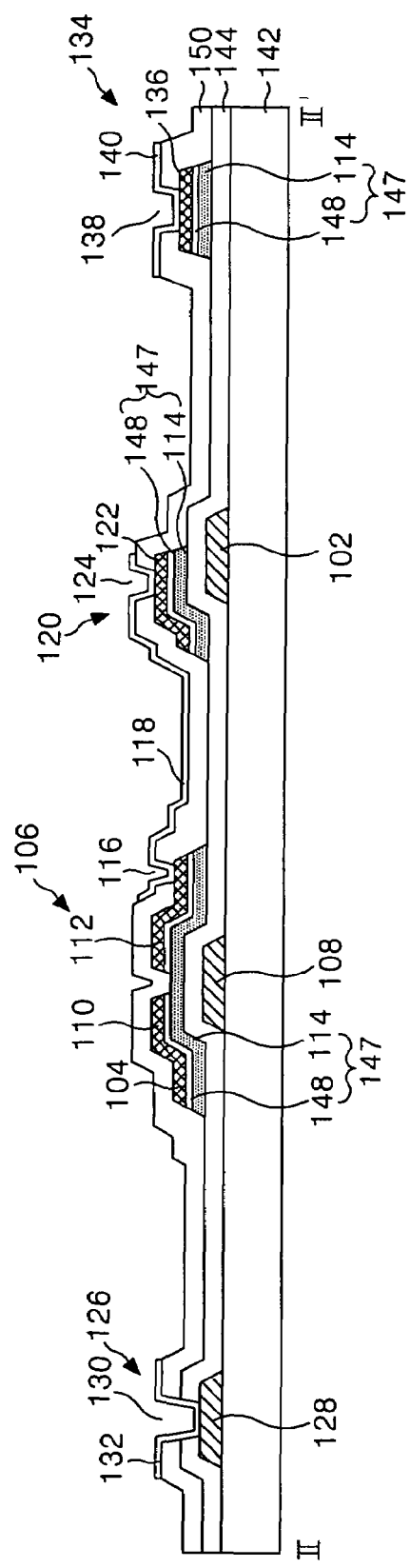

METHOD OF FABRICATING A THIN FILM TRANSISTOR ARRAY SUBSTRATE

This application claims the benefit of Korean Patent Application No. P2004-72141 filed in Korea on Sep. 9, 2004, which is hereby incorporated by reference.

FIELD OF THE INVENTION

This invention relates to a thin film transistor array substrate, and more particularly to a thin film transistor array substrate and a fabricating method thereof that are adaptive for simplifying a process as well as reducing a manufacturing cost.

DESCRIPTION OF THE RELATED ART

Generally, a liquid crystal display (LCD) controls light transmittance of a liquid crystal using an electric field to thereby display a picture. To this end, the LCD includes a liquid crystal display panel having liquid crystal cells arranged in a matrix, and a driving circuit for driving the liquid crystal display panel.

The liquid crystal display panel includes a thin film transistor array substrate and a color filter array substrate opposed to each other, a liquid crystal injected between two substrates, and a spacer for keep a cell gap between two substrates.

The thin film transistor array substrate consists of gate lines, data lines, thin film transistors formed as switching devices for each intersection between the gate lines and the data lines, pixel electrodes formed for each liquid crystal cell and connected to the thin film transistor, and alignment films coated thereon. The gate lines and the data lines receive signals from the driving circuits via each pad portion. The thin film transistor applies a pixel signal fed to the data line to the pixel electrode in response to a scanning signal fed to the gate line.

The color filter array substrate consists of color filters formed for each liquid crystal cell, black matrices for dividing color filters and reflecting external light, common electrodes for commonly applying reference voltages to the liquid crystal cells, and an alignment film coated thereon.

The liquid crystal display panel is completed by preparing the thin film array substrate and the color filter array substrate individually to join them and then injecting a liquid crystal between them and sealing it.

FIG. 1 is a plan view illustrating a related art thin film transistor array substrate, and FIG. 2 is a section view of the thin film transistor array substrate along the I-I' line in FIG. 1.

Referring to FIG. 1 and FIG. 2, the thin film transistor array substrate includes a gate line 2 and a data line 4 provided on a lower substrate 42 to intersect each other with a gate insulating film 44 therebetween, a thin film transistor 6 provided at each intersection, and a pixel electrode 18 provided at a cell area having a crossing structure. Further, the thin film transistor array substrate includes a storage capacitor 20 provided at an overlapped portion between the pixel electrode 18 and the pre-stage gate line 2, a gate pad portion 26 connected to the gate line 2, and a data pad portion 34 connected to the data line 4.

The thin film transistor 6 includes a gate electrode 8 connected to the gate line 2, a source electrode 10 connected to the data line 4, a drain electrode 12 connected to the pixel electrode 18, and a semiconductor pattern 47 overlapping with the gate electrode 8 and defining a channel between the source electrode 10 and the drain electrode 12. The semiconductor pattern 47 further includes an active layer 14, and an ohmic contact layer positioned on the active layer 14 to make ohmic contact with the source electrode 10 and the drain electrode 12. The thin film transistor 6 allows a pixel voltage signal applied to the data line 4 to be charged into the pixel electrode 18 and kept in response to a gate signal applied to the gate line 2.

The pixel electrode 18 is connected, via a first contact hole 16 passing through a protective film 50, to the drain electrode 12 of the thin film transistor 6. The pixel electrode 18 generates a potential difference with respect to a common electrode provided at an upper substrate (not shown) by the charged pixel voltage signal. This potential difference rotates a liquid crystal positioned between the thin film transistor array substrate and the upper substrate owing to a dielectric anisotropy and transmits a light inputted, via the pixel electrode 18, from a light source (not shown) toward the upper substrate.

The storage capacitor 20 consists of a storage electrode 22 overlapping with the pre-stage gate line 2 with the gate insulating film 44 therebetween, and a pixel electrode 22 overlapping with the storage electrode 22 with the protective film 50 therebetween and connected via a second contact hole 24 provided at the protective film 50. The storage capacitor 20 allows a pixel voltage signal charged in the pixel electrode 18 to be stably maintained until the next pixel voltage is charged.

The gate line 2 is connected, via the gate pad portion 26, to a gate driver (not shown). The gate pad portion 26 consists of a lower gate pad electrode 28 extended from the gate line 2, and an upper gate pad electrode 32 connected, via a third contact hole 30 passing through the gate insulating film 44 and the protective film 50, to the lower gate pad electrode 28.

The data line 4 is connected, via the data pad portion 34, to the data driver (not shown). The data pad portion 34 consists of a lower data pad electrode 36 extended from the data line 4, and an upper data pad electrode 40 connected, via a fourth contact hole 38 passing through the protective film 50, to the lower data pad electrode 36.

The thin film transistor array substrate having the above-mentioned structure is formed by a five mask process.

FIG. 3 is a flow chart representing that the thin film transistor array substrate shown in FIGS. 1 and 2 is formed by the five mask process.

At a step S2, a gate metal layer is formed on a lower substrate 42 and then is patterned by photolithography and etching using a first mask, thereby providing gate patterns including the gate line 2, the gate electrode 8 and the lower gate pad electrode 28.

At a step S4, the gate insulating film 44, an amorphous silicon layer and a $n^+$ amorphous silicon layer are sequentially formed on the lower substrate 42 provided with the gate patterns by a deposition technique such as plasma enhanced chemical vapor deposition (PECVD), etc. Thereafter, the amorphous silicon layer and the $n^+$ amorphous silicon layer are patterned by photolithography and etching using a second mask to thereby provide the semiconductor pattern 47 including the active layer 14 and the ohmic contact layer 48.

At a step S6, a source/drain metal layer is formed on the substrate 42 provided with the semiconductor pattern 47 by a deposition technique such as sputtering, etc. Thereafter, the source/drain metal layer is patterned by photolithography and etching using a third mask to thereby provide source/drain patterns including the data line 4, the source electrode 10, the drain electrode 12a and the storage electrode 22.

At a step S8, the protective film 50 having the first to fourth contact holes 16, 24, 30 and 38 is formed on the gate insulating film 44 provided with the source/drain patterns by photolithography and etching using a fourth mask.

At a step S10, a transparent electrode material is entirely deposited onto the substrate 42 provided with the protective film 50 by a deposition technique such as sputtering, etc. Thereafter, the transparent electrode material is patterned by photolithography and etching using a fifth mask to thereby provide transparent electrode patterns including the pixel electrode 18, the upper gate pad electrode 32 and the upper data pad electrode 40.

Such a related art thin film transistor array substrate has a complicated fabrication process, which increases the manufacturing cost of the liquid crystal display panel because it uses a plurality of mask process. To decrease costs, the thin film transistor array substrate using a reduction in the number of mask processes has been developed. This is because one mask process includes a lot of individual processes such as thin film deposition, cleaning, photolithography, etching, photo-resist stripping and inspection processes, etc. Recently, a four mask process that excludes one mask process from the existent standard five mask process has been developed.

FIG. 4 is a flow chart representing a procedure of forming the thin film transistor array substrate by a four mask process.

The four mask process shown in FIG. 4 has the same steps as the five mask process shown in FIG. 3 except that the semiconductor pattern including the active layer and the ohmic contact layer and the source/drain pattern are provided by a single mask.

Firstly, at a step S22, a gate metal layer is patterned by photolithography and etching using a first mask to thereby provide gate patterns including the gate line 2, the gate electrode 8 and the lower gate pad electrode 28.

At a step S24, the gate insulating film 44, an amorphous silicon layer and a $n^+$ amorphous silicon layer are sequentially formed on the lower substrate 42 provided with the gate patterns by a deposition technique such as plasma enhanced chemical vapor deposition (PECVD), etc.

At a step S26, the substrate provided with the $n^+$ amorphous silicon layer, etc. is unloaded at a depositing chamber for PECVD and the like and then is moved into a chamber for a deposition process such as sputtering, etc. Thereafter, a source/drain metal layer is formed on the substrate provided with the $n^+$ amorphous silicon layer, etc. by a deposition process such as sputtering, etc.

A photo-resist pattern is formed on the source/drain metal layer by photolithography using a second mask. Herein, the second mask employs a diffractive exposure mask having a diffractive exposure part at the channel portion of the thin film transistor, thereby allowing the photo-resist pattern at the channel portion to have a lower height than other source/drain patterns.

Subsequently, at a step S28, the source/drain metal layer is patterned by a wet etching process using the photo-resist pattern to thereby provide source/drain patterns including the data line 4, the source electrode 10, the drain electrode 12 being integral to the source electrode 10 and the storage electrode 22.

Next, the amorphous silicon layer and the $n^+$ amorphous silicon layer are simultaneously patterned by a dry etching process using the same photo-resist pattern to thereby provide the active layer 14 and the ohmic contact layer 48.

Further, the photo-resist pattern having a relatively low height at the channel portion is removed by ashing, and thereafter the source/drain pattern and the ohmic contact layer 48 at the channel portion is etched by dry etching. Thus, the active layer 14 at the channel portion is exposed to disconnect the source electrode 10 from the drain electrode 12.

Herein, the source/drain metal is selected from molybdenum (Mo), titanium (Ti), tantalum (Ta) or a molybdenum alloy, etc.

At a step S30, the protective film 50 is entirely formed on the gate insulating film 44 provided with the source/drain patterns by a deposition technique such as PECVD, etc. The protective film 50 is patterned by photolithography and etching using a third mask to thereby define the first to fourth contact holes 16, 24, 30 and 38. The first contact hole 16 is formed to pass through the protective film 50 and expose the drain electrode 12, whereas the second contact hole 24 is formed to pass through the protective film 50 and expose the storage electrode 22. The third contact hole 30 is formed to pass through the protective film 50 and the gate insulating film 44 and expose the lower gate pad electrode 28. The fourth contact hole 38 is formed to pass through the protective film 50 and expose the upper data pad electrode 36.

At a step S32, a transparent electrode material is entirely deposited onto the substrate 42 provided with the protective film 50 by a deposition technique such as sputtering, etc. Thereafter, the transparent electrode material is patterned by photolithography and etching using a fourth mask to thereby provide transparent electrode patterns including the pixel electrode 18, the upper gate pad electrode 32 and the upper data pad electrode 40. The pixel electrode 18 is electrically connected, via the first contact hole 16, to the drain electrode 12 while being electrically connected, via the second contact hole 24, to the storage electrode 22 overlapping with the pre-stage gate line 2. The upper gate pad electrode 32 is electrically connected, via the third contact hole 30, to the lower gate pad electrode 28. The upper data pad electrode 40 is electrically connected, via the fourth contact hole 38, to the lower data pad electrode 36.

As described above, the related art method of fabricating the thin film transistor array substrate adopts the four mask process, so that it can reduce the number of fabrication processes and thus can reduce the manufacturing cost proportional to the reduction in the number of fabrication processes in comparison with a method of adopting the five mask process. However, in the four mask process, the gate insulating film 44, the amorphous silicon layer and the $n^+$ amorphous silicon layer are formed by a deposition technique such as PECVD, etc., so that a transport process of loading and unloading the substrate 102 into and from equipment such as a depositing chamber is further required. Therefore, it is desirable to form the gate insulating film 44, the amorphous silicon layer, the $n^+$ amorphous silicon layer and the source/drain metal layer within a single piece of equipment.

SUMMARY OF THE INVENTION

By way of introduction only, in one aspect, a thin film transistor array substrate according to one aspect of the present invention includes a gate line formed on a substrate; a gate insulating film formed on the gate line; a data line intersecting the gate line with the gate insulating film therebetween and containing at least one of tungsten silicide ($WSi_x$), cobalt silicide ($CoSi_x$) or nickel silicide ($NiSi_x$); a thin film transistor provided at each intersection between the gate line and the data line; and a pixel electrode provided at a pixel area defined by each intersection between the gate line and the data line and connected to the thin film transistor.

In the thin film transistor array substrate, the thin film transistor includes a gate electrode connected to the gate line; a source electrode connected to the data line and formed from the same material as the data line; a drain electrode opposed to the source electrode and formed from the same material as the data line; and a semiconductor pattern having a channel provided between the source electrode and the drain electrode.

The thin film transistor array substrate further includes a storage capacitor including the gate line, and a storage electrode overlapping the gate line with the gate insulating film and the semiconductor pattern therebetween and formed from the same material as the data line.

A method of fabricating a thin film transistor array substrate according to another aspect of the present invention comprises forming a gate pattern including a gate line and a gate electrode on a substrate; forming a gate insulating film, an amorphous silicon layer and an $n^+$ amorphous silicon layer on the substrate provided with the gate pattern, and forming a source/drain metal layer containing at least one of tungsten silicide ($WSi_x$), cobalt silicide ($CoSi_x$) or nickel silicide ($NiSi_x$) by PECVD or MOCVD; patterning the amorphous silicon layer, the $n^+$ amorphous silicon layer and the source/drain metal layer to provide a semiconductor pattern and a source/drain pattern including the data line, the source electrode and the drain electrode formed on the semiconductor pattern; forming a protective film having a contact hole exposing a portion of the drain electrode on the substrate provided with the source/drain pattern; and forming a pixel electrode connected, via the contact hole, to the drain electrode.

In the method, forming the source/drain metal layer containing the tungsten silicide ($WSi_x$) by PECVD includes injecting reaction materials of $WF_6$, $SiH_4$ and $N_2$ into a chamber at about 325 to 425° C.; and forming a source/drain metal material containing the tungsten silicide (WSix) produced by a reaction of the reaction materials on the $n^+$ amorphous silicon layer.

Alternatively, forming the source/drain metal layer containing the cobalt silicide (CoSix) by PECVD includes injecting reaction materials of $Co(CO)_3NO$, $SiH_4$ and $H_2$ into a chamber at about 300 to 400° C.; and forming a source/drain metal material containing the cobalt silicide ($CoSi_x$) produced by a reaction of the reaction materials on the $n^+$ amorphous silicon layer.

Alternatively, the forming the source/drain metal layer using the nickel silicide ($NiSi_x$) includes forming a source/drain metal material containing the nickel silicide ($NiSi_x$) produced by making a phase-change of nickel (Ni) and silicon (Si) with respect to each other at about 200 to 300° C. on the $n^+$ amorphous silicon layer by MOCVD.

The method further comprises providing a storage capacitor including the gate line, and a storage electrode overlapping the gate line with the gate insulating film and the semiconductor pattern therebetween and formed from the same material as the data line.

A thin film transistor array substrate according to still another aspect of the present invention comprises a gate pattern including a gate line, a gate electrode connected to the gate line and a lower gate pad electrode extended from the gate line; a gate insulating film provided on the gate pattern; a source/drain pattern including a data line intersecting the gate line with the gate insulating film therebetween and containing at least one of tungsten silicide ($WSi_x$), cobalt silicide ($CoSi_x$) or nickel silicide ($NiSi_x$), a lower data pad electrode extended from the data line, a source electrode connected to the data line and a drain electrode opposed to the source electrode; a thin film transistor provided at each intersection between the gate line and the data line; and a pixel electrode provided at a pixel area defined by each intersection between the gate line and the data line and connected to the thin film transistor, an upper gate pad electrode connected to the lower gate pad electrode and an upper data pad electrode connected to the lower data pad electrode.

A method of fabricating a thin film transistor array substrate according to another aspect of the present invention comprises: forming a gate pattern including a gate line and a gate electrode on a substrate using a first mask process; forming a gate insulating film, an amorphous silicon layer and an $n^+$ amorphous silicon layer on the substrate provided with the gate pattern, and forming a source/drain metal layer within a single piece of equipment; patterning the amorphous silicon layer, the $n^+$ amorphous silicon layer and the source/drain metal layer using a second mask process to provide a semiconductor pattern and a source/drain pattern including the data line, the source electrode and the drain electrode formed on the semiconductor pattern; forming a protective film having a contact hole exposing a portion of the drain electrode on the substrate provided with the source/drain pattern using a third mask process; and forming a pixel electrode connected, via the contact hole, to the drain electrode using a fourth mask process.

BRIEF DESCRIPTION OF THE DRAWINGS

The invention will be apparent from the following detailed description of the embodiments of the present invention with reference to the accompanying drawings, in which:

FIG. 6 is a section view of the thin film transistor array substrate taken along the II-II' line in FIG. 5;

DETAILED DESCRIPTION OF THE PREFERRED EMBODIMENT

Reference will now be made in detail to the preferred embodiments of the present invention, examples of which are illustrated in the accompanying drawings.

Hereinafter, the preferred embodiments of the present invention will be described in detail with reference to FIGS. 5 to 10.

Figure 1:
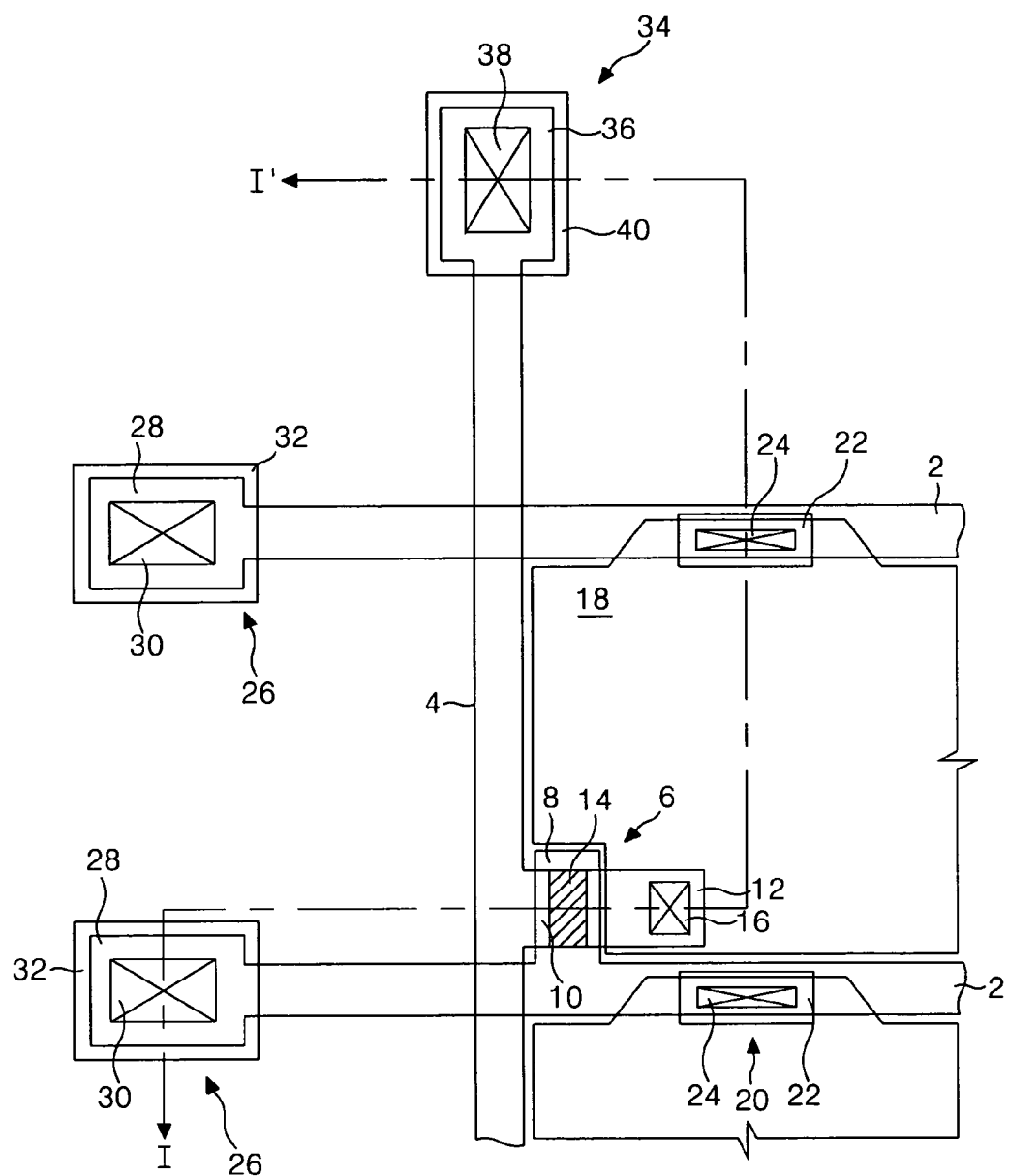
FIG. 1 is a plan view showing a portion of a related art thin film transistor array substrate.
Figure 2:
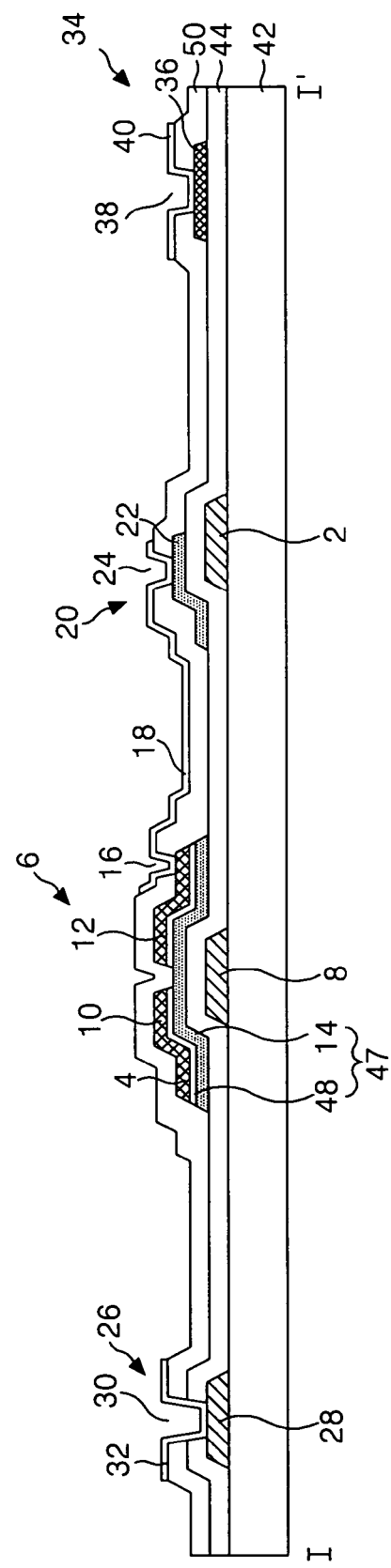
FIG. 2 is a section view of the thin film transistor array substrate taken along the I-I' line in FIG. 1.
Figure 3:
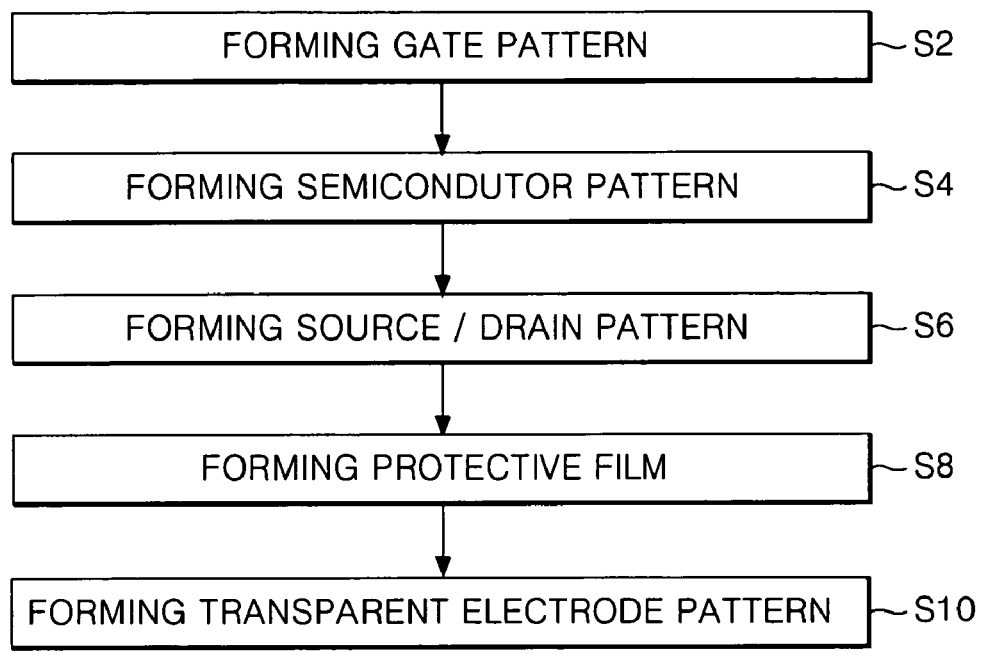
FIG. 3 is a flow chart representing forming the thin film transistor array substrate by the related art five mask process.
Figure 4:
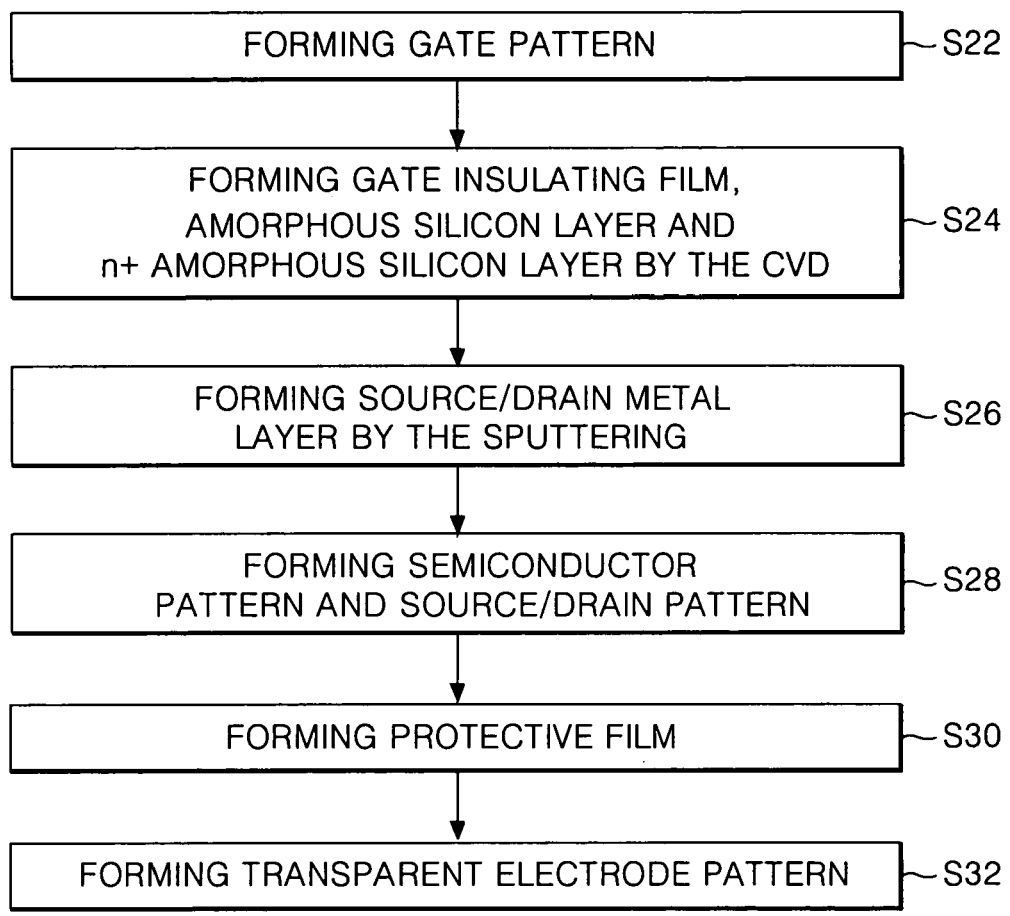
FIG. 4 is a flow chart representing forming the thin film transistor array substrate by the related art four mask process.
Figure 5:
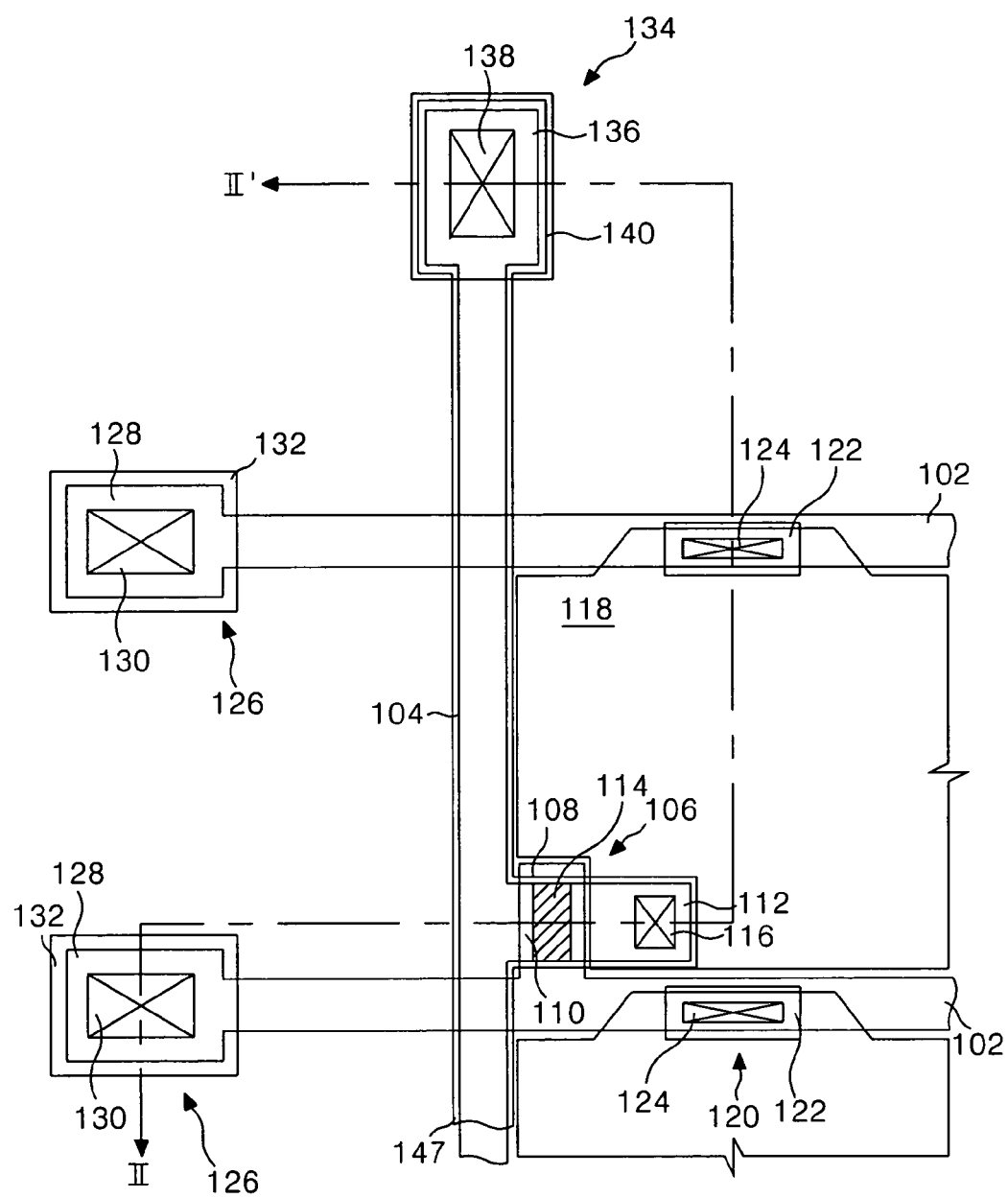
FIG. 5 is a plan view showing a structure of a thin film transistor array substrate according to an embodiment of the present invention.

FIG. 5 is a plan view showing a structure of a thin film transistor array substrate according to an embodiment of the present invention, and FIG. 6 is a section view of the thin film transistor array substrate taken along the II-II' line in FIG. 5.

Referring to FIG. 5 and FIG. 6, the thin film transistor array substrate includes a gate line 102 and a data line 104 provided on a lower substrate 142 to intersect each other with a gate insulating film 144 therebetween, a thin film transistor 106 adjacent to each intersection, and a pixel electrode 118 provided at a pixel area defined by the intersection structure. Further, the thin film transistor array substrate includes a storage capacitor 120 provided at an overlapped portion between the pixel electrode 118 and the pre-stage gate line 102, a gate pad portion 126 connected to the gate line 102, and a data pad portion 134 connected to the data line 104.

The thin film transistor 106 includes a gate electrode 108 connected to the gate line 102, a source electrode 110 connected to the data line 104, a drain electrode 112 connected to the pixel electrode 118, and an active layer 114 overlapping with the gate electrode 108 and defining a channel between the source electrode 110 and the drain electrode 112. The active layer 114 is formed to overlap with a lower data pad electrode 136, a storage electrode 122, the data line 104, the source electrode 110 and the drain electrode 112, and further includes a channel portion between the source electrode 110 and the drain electrode 112. On the active layer 114, an ohmic contact layer 148 for making an ohmic contact with the lower data pad electrode 136, the storage electrode 122, the data line 104, the source electrode 110 and the drain electrode 112 is further provided. The thin film transistor 106 allows a pixel voltage signal applied to the data line 104 to be charged into the pixel electrode 118 and kept in response to a gate signal applied to the gate line 102.

The pixel electrode 118 is connected, via a first contact hole 116 passing through a protective film 150, to the drain electrode 112 of the thin film transistor 106. The pixel electrode 118 generates a potential difference with respect to a common electrode provided at an upper substrate (not shown) by the charged pixel voltage signal. This potential difference rotates a liquid crystal positioned between the thin film transistor array substrate and the upper substrate owing to a dielectric anisotropy and transmits a light inputted, via the pixel electrode 118, from a light source (not shown) toward the upper substrate.

The storage capacitor 120 consists of a pre-stage gate line 102, a storage electrode 122 overlapping with the gate line 102 with the gate insulating film 144, the active layer 114 and the ohmic contact layer 148 therebetween, and a pixel electrode 122 overlapping with the storage electrode 122 with the protective film 150 therebetween and connected via a second contact hole 124 provided at the protective film 150. The storage capacitor 120 allows a pixel voltage signal charged in the pixel electrode 118 to be stably maintained until the next pixel voltage is charged.

The gate line 102 is connected, via the gate pad portion 126, to a gate driver (not shown). The gate pad portion 126 consists of a lower gate pad electrode 128 extended from the gate line 102, and an upper gate pad electrode 132 connected, via a third contact hole 130 passing through the gate insulating film 144 and the protective film 150, to the lower gate pad electrode 128.

The data line 104 is connected, via the data pad portion 134, to the data driver (not shown). The data pad portion 134 consists of a lower data pad electrode 136 extended from the data line 104, and an upper data pad electrode 140 connected, via a fourth contact hole 138 passing through the protective film 150, to the lower data pad electrode 136.

Herein, a source/drain pattern including the data line 104, the source/drain electrodes 110 and 112, the storage electrode 122 and the lower data pad electrode 136 contains any at least one of tungsten silicide ($WSi_x$), cobalt silicide ($CoSi_x$) and nickel silicide ($NiSi_x$). Tungsten silicide ($WSi_x$), cobalt silicide ($CoSi_x$) and nickel silicide ($NiSi_x$) are materials capable of being deposited by CVD. A source/drain metal layer can be formed by depositing equipment used upon formation of a gate insulating film, an amorphous silicon layer and an $n^+$ amorphous silicon layer.

Figure 7A:
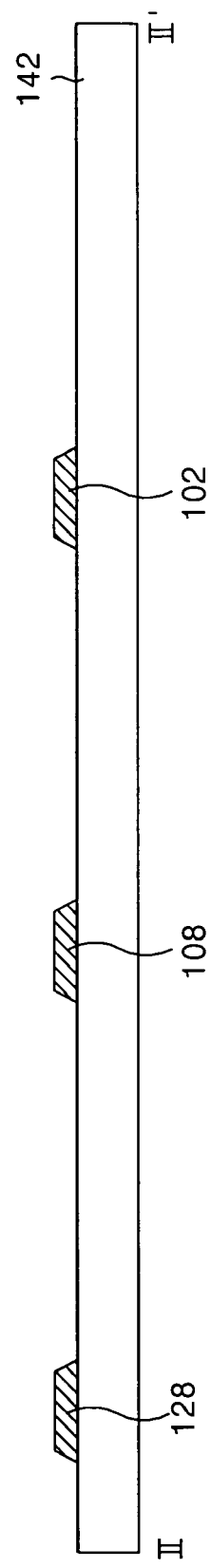
FIG. 7A to FIG. 7D are section views illustrating a method of fabricating the thin film transistor array substrate according to a first embodiment of the present invention.
Figure 7B:
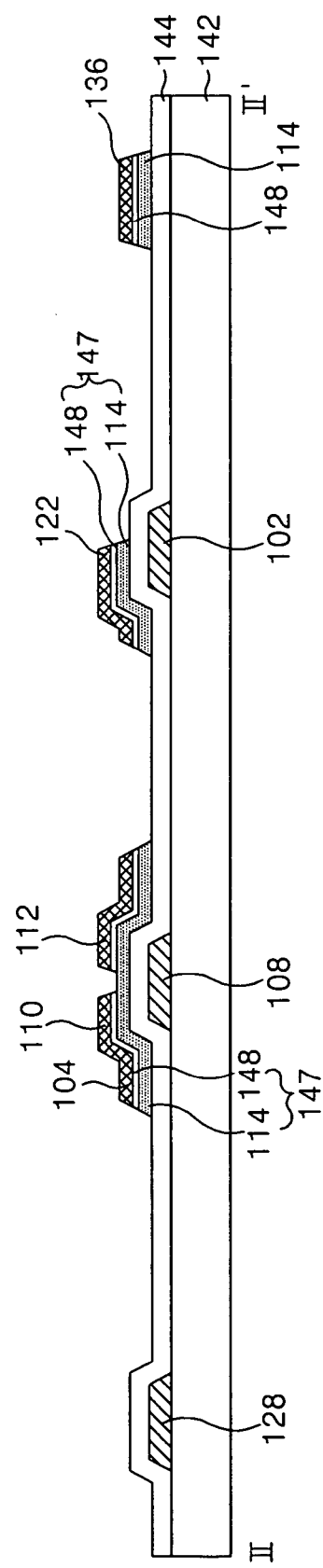
Figure 7C:
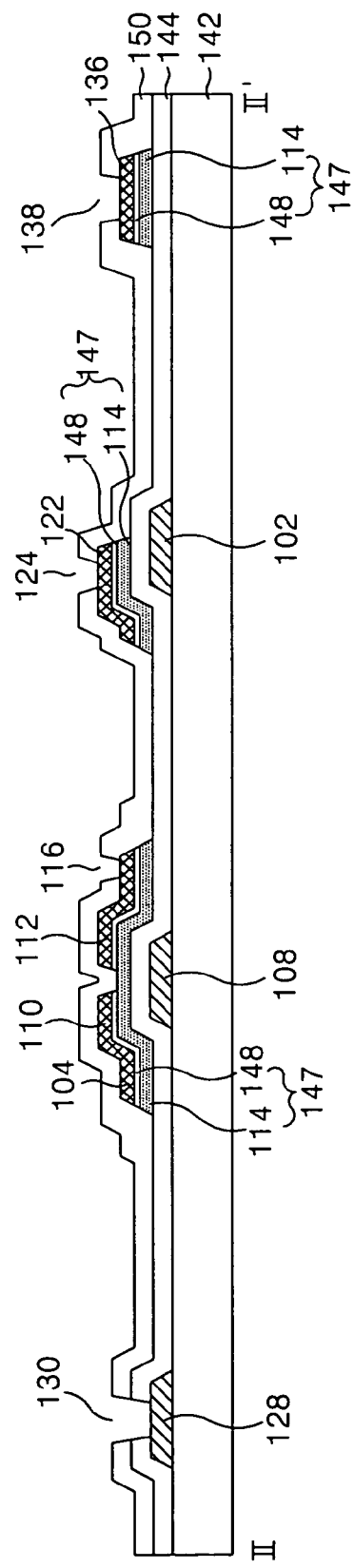
Figure 7D:
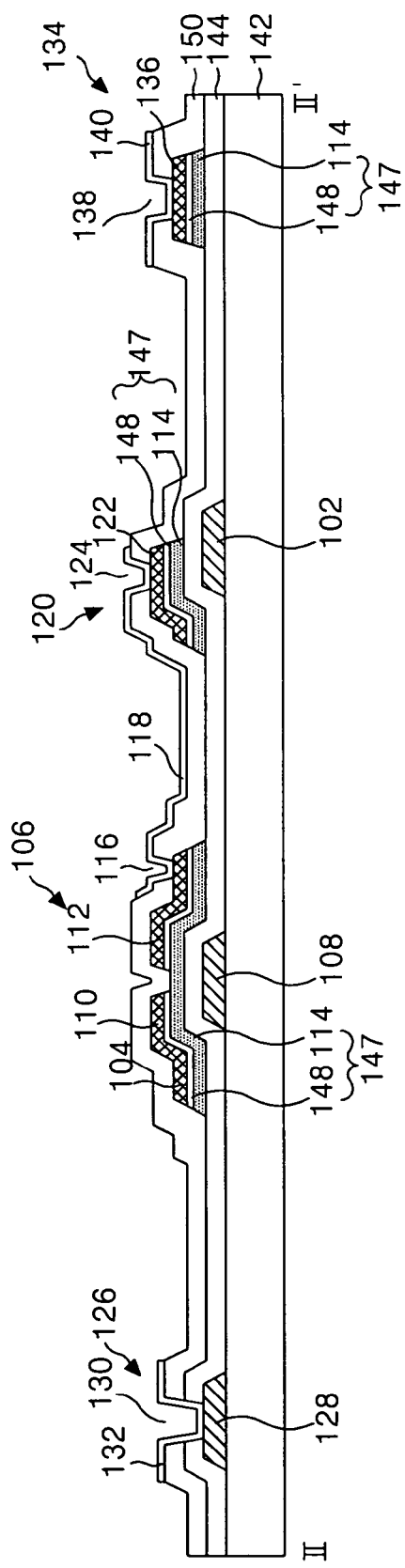
Figure 8:
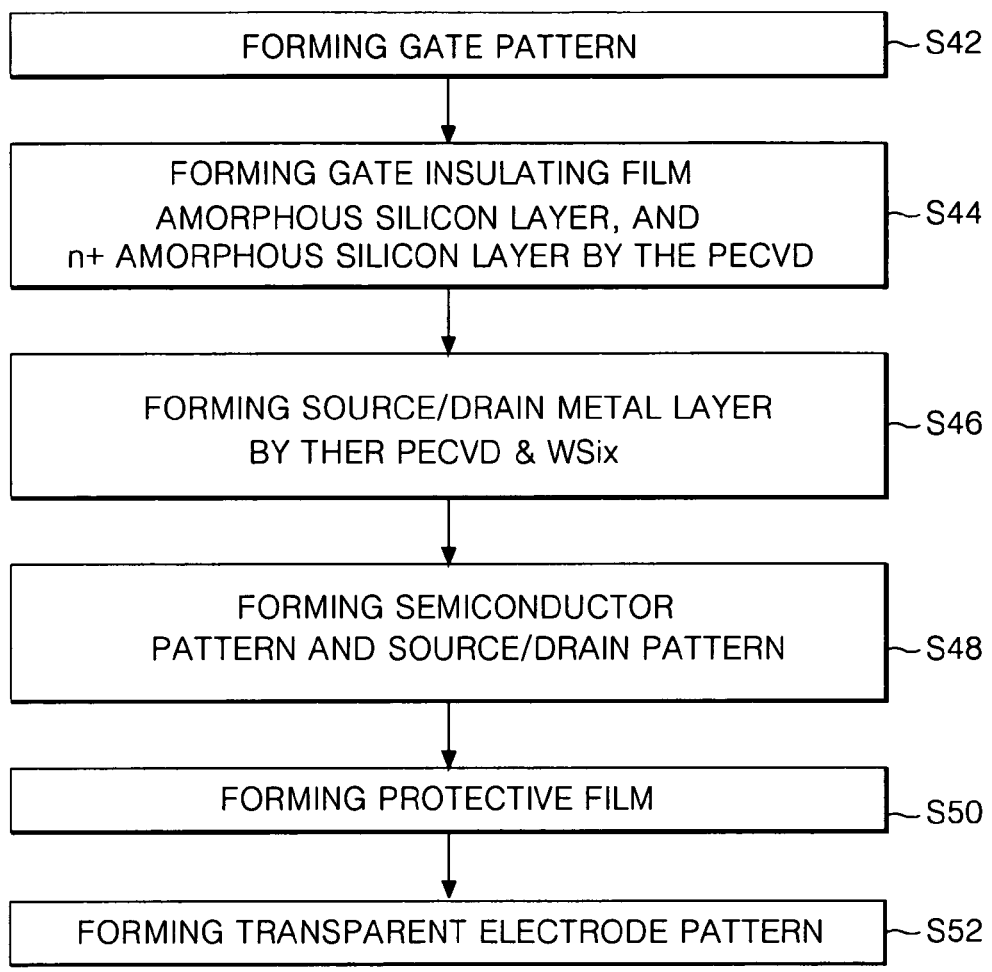
FIG. 8 is a flow chart representing forming a thin film transistor array substrate according the first embodiment of the present invention.

FIG. 7A to FIG. 7D are section views illustrating a method of fabricating the thin film transistor array substrate according to a first embodiment of the present invention, and FIG. 8 is a flow chart representing formation of the thin film transistor array substrate.

Referring to FIG. 7A, gate patterns are provided on a lower substrate 142.

At a step S42, a gate metal layer is formed on the lower substrate 142 by a deposition technique such as sputtering. Then, the gate metal layer is patterned by photolithography and etching using a first mask to thereby provide the gate patterns including the gate line 102, the gate electrode 108 and the lower gate pad electrode 128. The gate metal layer has a single-layer or double-layer structure of chrome (Cr), molybdenum (Mo) or an aluminum group metal, etc.

Referring to FIG. 7B, the gate insulating film 144, the active layer 114, the ohmic contact layer 148 and source/drain patterns are sequentially formed on the lower substrate 142 provided with the gate patterns.

At a step S44, the gate insulating film 144, an amorphous silicon layer and an $n^+$ amorphous silicon layer are sequentially formed on the lower substrate 142 provided with the gate patterns by a deposition technique such as plasma enhanced chemical vapor deposition (PECVD), etc. Subsequently, at a step S46, a source/drain metal layer is formed by depositing equipment and a deposition technique used upon formation of the gate insulating film 144, the amorphous silicon layer and the $n^+$ amorphous silicon layer, that is, by a deposition technique such as PECVD, etc.

Herein, $WF_6$, $SiH_4$ and $N_2$ are used at about 325 to 425° C. upon deposition of the source/drain metal layer, so that the source/drain metal layer contains tungsten silicide ($WSi_x$).

In other words, the source/drain metal layer containing tungsten silicide ($WSi_x$) is formed on the substrate 142 provided with the $n^+$ amorphous silicon layer by a reaction of $WF_6$, $SiH_4$ and $N_2$, etc. within a chamber at about 325 to 425° C.

A photo-resist pattern is formed on the source/drain metal layer by photolithography using a second mask. Herein, the second mask employs a diffractive exposure mask having a diffractive exposure part at the channel portion of the thin film transistor, thereby allowing the photo-resist pattern at the channel portion to have a lower height than other source/drain patterns.

Subsequently, at a step S48, the source/drain metal layer is patterned by wet etching using the photo-resist pattern to thereby provide source/drain patterns including the data line 104, the source electrode 110, the drain electrode 112 being integral to the source electrode 110 and the storage electrode 122.

Next, the amorphous silicon layer and the $n^+$ amorphous silicon layer are simultaneously patterned by dry etching using the same photo-resist pattern to thereby provide the active layer 114 and the ohmic contact layer 148.

Further, the photo-resist pattern having a relatively low height at the channel portion is removed by ashing, and thereafter the source/drain pattern and the ohmic contact layer 148 at the channel portion is etched by etching. Thus, the active layer 114 at the channel portion is exposed to disconnect the source electrode 110 from the drain electrode 112.

Subsequently, the photo-resist pattern left on the source/drain patterns is removed by stripping.

Herein, the gate insulating film 144 is formed from an inorganic insulating material such as silicon nitride ($SiN_x$) or silicon oxide ($SiO_x$).

Referring to FIG. 7C, the protective film 150 including first to fourth contact holes 116, 124, 130 and 138 is formed on the gate insulating film 144 provided with the source/drain patterns.

At a step S50, the protective film 150 is patterned by photolithography and etching using a third mask to thereby define the first to fourth contact holes 116, 124, 130 and 138. The first contact hole 116 is formed to pass through the protective film 150 and expose the drain electrode 112, whereas the second contact hole 124 is formed to pass through the protective film 150 and expose the storage electrode 122. The third contact hole 130 is formed to pass through the protective film 150 and the gate insulating film 144 and expose the lower gate pad electrode 128. The fourth contact hole 138 is formed to pass through the protective film 150 and expose the lower data pad electrode 136.

Herein, the protective film 150 is made from an inorganic insulating material identical to the gate insulating film 144, or an organic insulating material such as an acrylic organic compound having a small dielectric constant, BCB (benzocyclobutene) or PFCB (perfluorocyclobutane), etc.

Referring to FIG. 7D, transparent electrode patterns are provided on the protective film 150.

At a step S52, a transparent electrode material is entirely deposited onto the protective film 150 by a deposition technique such as sputtering, etc. Thereafter, the transparent electrode material is patterned by photolithography and etching using a fourth mask to thereby provide transparent electrode patterns including the pixel electrode 118, the upper gate pad electrode 132 and the upper data pad electrode 140. The pixel electrode 118 is electrically connected, via the first contact hole 116, to the drain electrode 112 while being electrically connected, via the second contact hole 124, to the storage electrode 122 overlapping with the pre-stage gate line 102. The upper gate pad electrode 132 is electrically connected, via the third contact hole 130, to the lower gate pad electrode 128. The upper data pad electrode 140 is electrically connected, via the fourth contact hole 138, to the lower data pad electrode 136. Herein, the transparent electrode material is selected from indium-tin-oxide (ITO), tin-oxide (TO), indium-zinc-oxide (IZO) or the like.

As described above, the method of fabricating the thin film transistor array substrate according to the first embodiment of the present invention can deposit the source/drain metal layer by PECVD, thereby forming the source/drain metal layer with the aid of the same deposition equipment used upon formation of the gate insulating film, the amorphous silicon layer and the $n^+$ amorphous silicon layer. Accordingly, it becomes possible to simplify the process and hence reduce the manufacturing cost.

Figure 9:
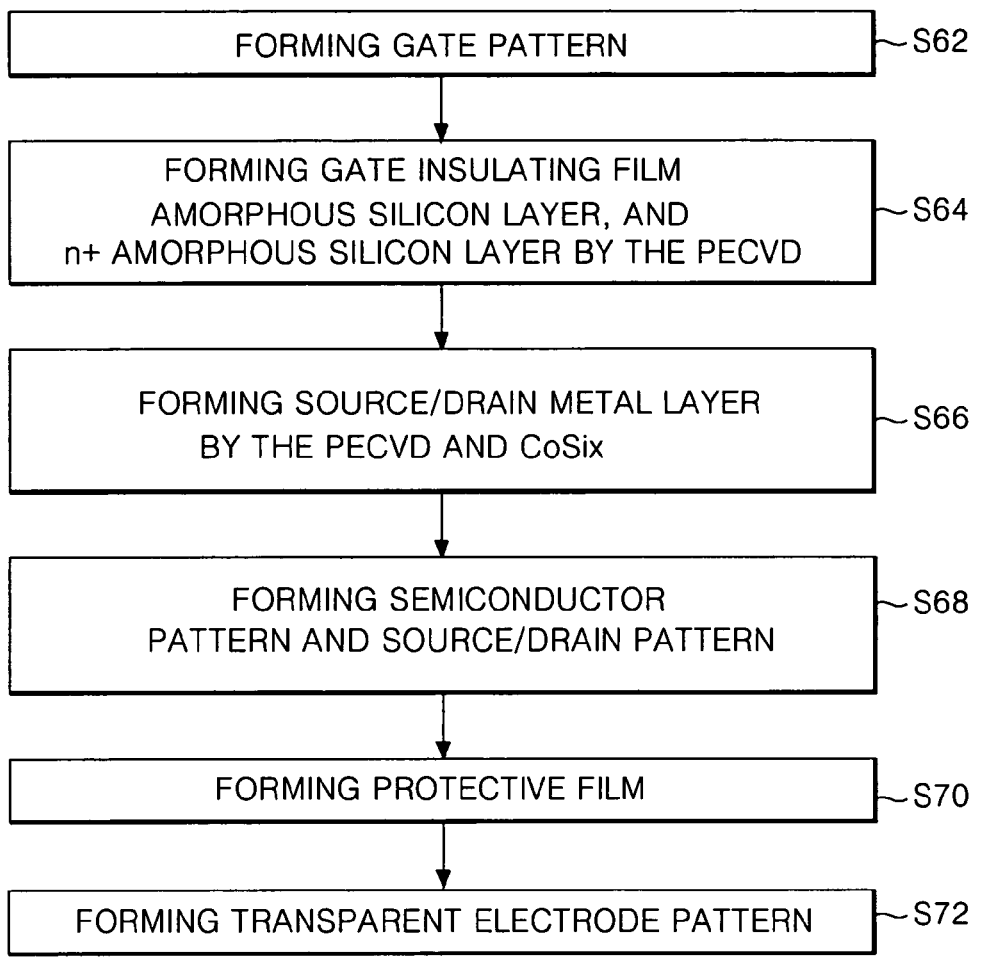
FIG. 9 is a flow chart representing forming a thin film transistor array substrate according a second embodiment of the present invention.

FIG. 9 is a flow chart representing each step of forming a thin film transistor array substrate according a second embodiment of the present invention.

Firstly, the method of fabricating the thin film transistor array substrate according to the second embodiment of the present invention is similar to the method of fabricating the thin film transistor array substrate according to the first embodiment of the present invention except for a reaction material of the source/drain metal layer and an environment in the formation process of the source/drain metal. Therefore, a detailed explanation as to the contents similar to FIG. 7A to FIG. 7D will be omitted.

At a step S62, gate patterns including the gate line 102, the gate electrode 108 and the lower gate pad electrode 128 are provided on a lower substrate 142. Then, at a step S64, the gate insulating film 144, an amorphous silicon layer and a $n^+$ amorphous silicon layer are sequentially formed thereon by a deposition technique such as plasma enhanced chemical vapor deposition (PECVD), etc. Subsequently, at a step S66, a source/drain metal layer is formed by depositing equipment and a deposition technique used upon formation of the gate insulating film 144, the amorphous silicon layer and the $n^+$ amorphous silicon layer, that is, by a deposition technique such as PECVD, etc.

Herein, $Co(CO)_3NO$, $SiH_4$ and $H_2$ is used in an environment of about 300 to 400° C. upon deposition of the source/drain metal layer, so that the source/drain metal layer contains cobalt silicide ($CoSi_x$). In other words, the source/drain metal layer containing cobalt silicide ($CoSi_x$) is formed on the substrate 142 provided with the n+amorphous silicon layer by a reaction of $Co(CO)_3NO$, $SiH_4$ and $H_2$, etc. within a chamber at about 300 to 400° C.

Thereafter, at a step S68, the amorphous silicon layer, the $n^+$ amorphous silicon layer and the source/drain metal layer are patterned by photolithography and etching using a diffractive exposure mask to thereby provide the source/drain pattern including the data line 104, the source electrode 110, the drain electrode 112 and the storage electrode 122; and a semiconductor pattern 147 including the active layer 114 and the ohmic contact layer 148.

Next, at a step S70, the protective film 150 including first to fourth contact holes 116, 124, 130 and 138 is formed. Finally, at a step S72, transparent electrode patterns including the pixel electrode 118, the upper gate pad electrode 132 and the upper data pad electrode 140 are formed.

As described above, the method of fabricating the thin film transistor array substrate according to the second embodiment of the present invention can deposit the source/drain metal layer by PECVD, thereby forming the source/drain metal layer with the aid of the same deposition equipment used upon formation of the gate insulating film, the amorphous silicon layer and the $n^+$ amorphous silicon layer. Accordingly, it becomes possible to simplify the process and hence reduce the manufacturing cost.

Figure 10:
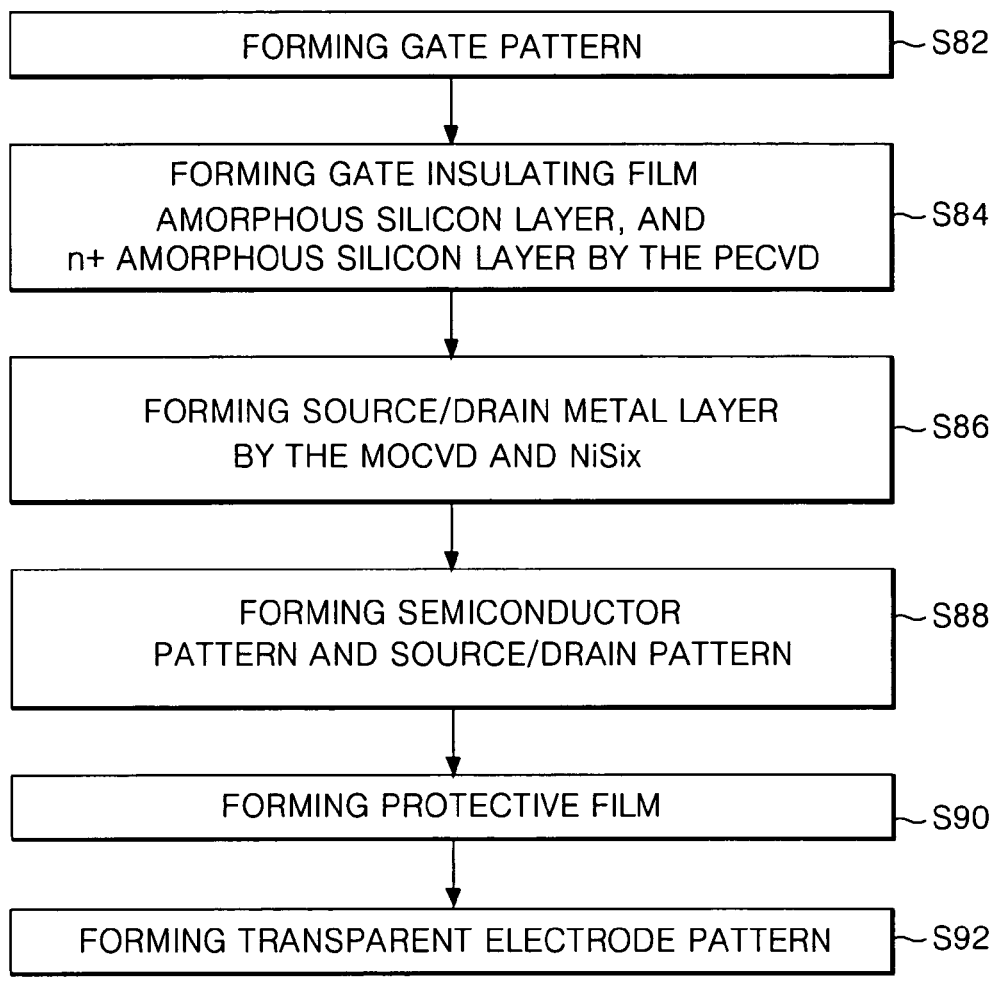
FIG. 10 is a flow chart representing forming a thin film transistor array substrate according a third embodiment of the present invention.

FIG. 10 is a flow chart representing each step of forming a thin film transistor array substrate according a third embodiment of the present invention.

Firstly, the method of fabricating the thin film transistor array substrate according to the third embodiment of the present invention is similar to the method of fabricating the thin film transistor array substrate according to the first embodiment of the present invention except that the source/drain metal layer is formed by metal-organic chemical vapor deposition (MOCVD); and the source/drain metal layer and an environment in the formation process of the source/drain metal is different. Therefore, a detailed explanation as to the contents similar to FIG. 7A to FIG. 7D will be omitted.

At a step S82, gate patterns including the gate line 102, the gate electrode 108 and the lower gate pad electrode 128 are provided on a lower substrate 142. Then, at a step S84, the gate insulating film 144, an amorphous silicon layer and a $n^+$ amorphous silicon layer are sequentially formed thereon by a deposition technique such as plasma enhanced chemical vapor deposition (PECVD), etc.

Subsequently, at a step S86, a source/drain metal layer is formed by depositing equipment used upon formation of the gate insulating film 144, the amorphous silicon layer and the $n^+$ amorphous silicon layer and a deposition technique such as MOCVD, etc.

Herein, deposition of the source/drain metal layer is carried out in an environment of about 200 to 300° C. and Ni and Si are used as a reaction material of the source/drain metal, so that the source/drain metal layer contains nickel silicide ($NiSi_x$). The nickel silicide ($NiSi_x$) is formed by phase-changing Ni and Si reacted at a low temperature of 200 to 300° C. with respect to each other.

Thereafter, at a step S88, the amorphous silicon layer, the $n^+$ amorphous silicon layer and the source/drain metal layer are patterned by photolithography and etching using a diffractive exposure mask to thereby provide the source/drain pattern including the data line 104, the source electrode 110, the drain electrode 112 and the storage electrode 122; and a semiconductor pattern 147 including the active layer 114 and the ohmic contact layer 148.

Next, at a step S90, the protective film 150 including first to fourth contact holes 116, 124, 130 and 138 is formed. Finally, at a step S92, transparent electrode patterns including the pixel electrode 118, the upper gate pad electrode 132 and the upper data pad electrode 140 are formed.

As described above, the method of fabricating the thin film transistor array substrate according to the third embodiment of the present invention can deposit the source/drain metal layer by MOCVD, thereby forming the source/drain metal layer with the aid of the same deposition equipment used upon formation of the gate insulating film, the amorphous silicon layer and the $n^+$ amorphous silicon layer. Accordingly, it becomes possible to simplify the process and hence reduce the manufacturing cost.

Alternatively, in the first and second embodiments of the present invention, the source/drain metal layer may be formed by MOCVD rather than PECVD. Further, in the third embodiment of the present invention, the source/drain metal layer may be formed by PECVD rather than MOCVD.

As described above, according to the present invention, the source/drain metal layer can be formed by the same depositing equipment used upon formation of the gate insulating film, the amorphous silicon layer and the $n^+$ amorphous silicon layer and by PECVD or MOCVD. Accordingly, it becomes possible to simplify the process and hence reduce the manufacturing cost.

Although the present invention has been explained by the embodiments shown in the drawings described above, it should be understood to the ordinary skilled person in the art that the invention is not limited to the embodiments, but rather that various changes or modifications thereof are possible without departing from the spirit of the invention. Accordingly, the scope of the invention shall be determined only by the appended claims and their equivalents.

What is claimed is:

1. A method of fabricating a thin film transistor array substrate, the method comprising:
   forming a gate pattern including a gate line and a gate electrode on a substrate;
   forming a gate insulating film, an amorphous silicon layer and an $n^+$ amorphous silicon layer on the substrate provided with the gate pattern, and forming a source/drain metal layer containing at least one material of tungsten silicide ($WSi_x$), cobalt silicide ($CoSi_x$) or nickel silicide ($NiSi_x$);
   wherein the gate pattern, the gate insulating film, the amorphous silicon layers, and the source/drain metal layers are all formed by PECVD or MOCVD without removing the substrate from a processing environment in which the chemical vapor deposition process occurs;
   patterning the amorphous silicon layer, the $n^+$ amorphous silicon layer and the source/drain metal layer to provide a semiconductor pattern and a source/drain pattern including the data line, the source electrode and the drain electrode formed on the semiconductor pattern;
   wherein patterning the amorphous silicon layer, the $n^+$ amorphous silicon layer and the source/drain metal layer include patterning the source/drain metal layer by wet etching process, simultaneously patterning the amorphous silicon layer and the $n^+$ amorphous silicon layer by dry etching process, removing a photo resist pattern by ashing process, forming the source electrode and the drain electrode by etching process;
   forming a protective film having a contact hole exposing a portion of the drain electrode on the substrate provided with the source/drain pattern; and
   forming a pixel electrode connected, via the contact hole, to the drain electrode.

2. The method as claimed in claim 1, wherein forming the source/drain metal layer includes:
   injecting reaction materials comprising $WF_6$, $SiH_4$ and $N_2$ into a chamber at about 325 to 425° C.; and
   forming a source/drain metal material containing the tungsten silicide ($WSi_x$) produced by a reaction of the reaction materials on the $n^+$ amorphous silicon layer.

3. The method as claimed in claim 2, wherein forming the source/drain metal layer includes:
   injecting reaction materials of $Co(CO)_3NO$, $SiH_4$ and $H_2$ into a chamber at about 300 to 400° C.; and
   forming a source/drain metal material containing the cobalt silicide ($CoSi_x$) produced by a reaction of the reaction materials on the $n^+$ amorphous silicon layer.

4. The method as claimed in claim 2, wherein forming the source/drain metal layer includes:
   forming a source/drain metal material containing the nickel silicide ($NiSi_x$) produced by making a phase-change of nickel (Ni) and silicon (Si) with respect to each other at about 200 to 300° C. on the $n^+$ amorphous silicon layer by MOCVD.

5. The method as claimed in claim 2, further comprising:
   providing a storage capacitor including the gate line, and a storage electrode overlapping the gate line with the gate insulating film and the semiconductor pattern therebetween and formed from the same material as the data line.

* * * * *